United States Patent [19]
Grundy

[11] 3,980,970
[45] Sept. 14, 1976

[54] VOLTAGE CONTROLLED OSCILLATOR CIRCUIT

[75] Inventor: Reed H. Grundy, Murrysville, Pa.

[73] Assignee: Westinghouse Air Brake Company, Swissvale, Pa.

[22] Filed: Feb. 10, 1975

[21] Appl. No.: 548,424

[52] U.S. Cl. .............................. 331/108 D; 331/111
[51] Int. Cl.² .......................................... H03K 3/26
[58] Field of Search ............ 331/108 C, 108 D, 111

[56] References Cited
UNITED STATES PATENTS

| | | | |
|---|---|---|---|
| 3,587,001 | 6/1971 | Parchim | 331/111 |
| 3,621,469 | 11/1971 | Bauer | 331/111 |
| 3,637,951 | 1/1972 | Brown, Jr. | 331/108 D |
| 3,713,046 | 1/1973 | Wong et al. | 331/108 D |
| 3,736,528 | 5/1973 | Acker et al. | 331/108 D |
| 3,742,384 | 6/1973 | Breitzmann | 331/108 D |
| 3,824,496 | 7/1974 | Hekimian | 331/108 D |

*Primary Examiner*—John Kominski
*Attorney, Agent, or Firm*—J. B. Sotak; R. W. McIntire, Jr.

[57] ABSTRACT

This disclosure relates to a solid-state voltage controlled oscillating circuit arrangement employing a differential type of integrated circuit operational amplifier and a transistorized output amplifier. The operational amplifier includes an inverting input coupled to a source of reference potential and a noninverting input coupled to an input signal source. The operational amplifier is provided with hysteresis for causing a dead band zone to occur until the signal on the noninverting input exceeds a predetermined value so that the operational amplifier toggles and produces output signal pulses having a frequency which is proportional to the amplitude of the input signal applied to the noninverting input. The output signal pulses are amplified by a transistorized output amplifier.

10 Claims, 1 Drawing Figure

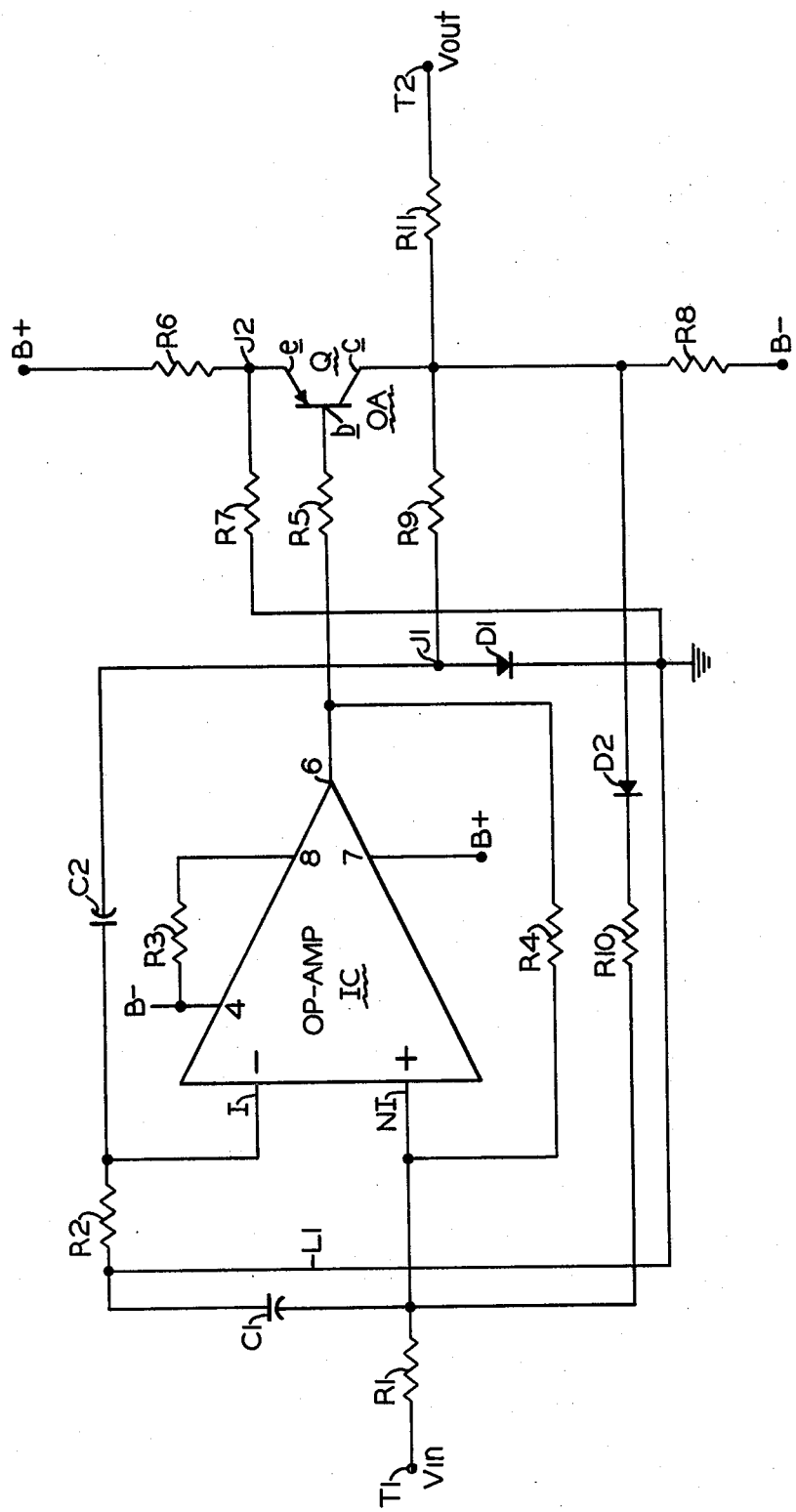

VOLTAGE CONTROLLED OSCILLATOR CIRCUIT

SUBJECT OF THE INVENTION

This invention relates to an electronic analog to digital interface circuit arrangement and more particularly to a solid-state voltage control oscillator circuit having a dead band and voltage to frequency response characteristic and employing a differential type of integrated circuit operational amplifier and a transistorized output amplifier.

BACKGROUND OF THE INVENTION

In certain types of signal and control systems for railroad and mass and/or rapid transit operations, it is normal practice to regulate and control the acceleration and deceleration of a moving vehicle or train as it proceeds along its route of travel. Generally, speed command signals in the form of modulated or coded carrier wave forms are inductively coupled to the vehicle or train via a pick-up device. The picked-up modulated carrier signals are amplified, demodulated, shaped, limited, and decoded and filtered and are then employed to control to electrical state or condition of a speed decoding unit. In order to effectively control the positive and negative tractive apparatus, the actual speed of the moving vehicle or train must be compared with the picked-up and recovered speed command signal. In practice, an axle tachometer in the form of a frequency generator produces signals which are proportional to the actual speed of the moving vehicle or train. The recovered speed command signals and the actual speed signals are then compared to produce a differential signal to determine whether an accelerating or decelerating effort should be effected on the vehicle. In automatic train operation (ATO), the determination of whether positive or negative tractive effort should be applied to the vehicle is generally accomplished by digital logic circuits and networks. However, it will be appreciated that the differential speed signals are analog in nature, and thus an analog to digital (AN) conversion or interface circuit is necessary for coupling the analog speed sensing apparatus with the digital logic equipment. In the past, such interface circuits were very costly to construct and maintain due to the complexity and the excessive number of electrical and electronic components which were required to be used and assembled. In addition, the reliability of an electrical or electronic circuit or network may be greatly enhanced by simplifying and reducing the complexity of the circuit and by employing the minimal number of components. Thus, it is apparent that the optimum type of circuits or apparatus for car-carried equipment should be simple as possible in construction in order to minimize initial purchase and subsequent maintenance costs and also to maximize the efficiency, reliability and operability.

OBJECTS OF THE INVENTION

Accordingly, it is an object of this invention to provide a new and improved electronic analog to digital interface circuit.

Another object of this invention is to provide a novel solid-state voltage controlled oscillator circuit having a dead band zone and a voltage to frequency response characteristic.

A further object of this invention is to provide a unique electronic voltage controlled oscillating circuit arrangement employing an integrated circuit operational amplifier and a transistorized output amplifier.

Still another object of this invention is to provide an improved voltage controlled oscillator circuit having hysteresis for causing a dead band zone and for producing output pulses having a frequency proportional to the amplitude of an input voltage.

Still a further object of this invention is to provide an electronic voltage controlled oscillating circuit arrangement employing an operational amplifier having an inverting and a noninverting and an output coupled to the input of an output amplifier for producing amplified signal pulses having a repetitious rate proportional to the amplitude of the input signal applied to the noninverting input of the operational amplifier.

Yet another object of this invention is to provide a solid-state voltage controlled oscillator circuit having a dead band zone and a voltage to frequency response characteristic including an operational amplifier having an inverting and a noninverting input and an output, an input signal coupled to the noninverting input and a reference signal coupled to the inverting input, the operational amplifier having hysteresis for causing the dead band zone to occur until the input signal on the noninverting input reaches a predetermined level so that the operational amplifier toggles and produces signal pulses having a frequency proportional to the amplitude of the input signal, and an output amplifier coupled to the output of the operational amplifier for amplifying the signal pulses.

Still a further object of this invention is to provide a new and improved electronic voltage controlled oscillator circuit which is simple in design, economical in cost, reliable in use, durable in service and efficient in operation.

SUMMARY OF THE INVENTION

In accordance with the present invention the electronic voltage controlled oscillator circuit includes a differential type of integrated circuit operational amplifier and a transistorized output amplifier. The operational amplifier includes an inverting and a noninverting input and an output. The inverting input is coupled to a grounded reference level by a first resistor. The noninverting input is coupled to an input terminal of a source of input signals by a current-limiting resistor. A charging capacitor is connected between the noninverting input and one end of the first resistor. A series connected diode and capacitor are coupled between the other end of the first resistor and ground. The output of the differential amplifier is coupled to the noninverting input via a feedback resistor. The output of the operational amplifier is also coupled to the base electrode of the transistorized amplifier by a second resistor. A voltage divider including a series connected third and fourth resistor is coupled between the positive terminal of a d.c. supply voltage and ground. The emitter electrode of the transistorized output amplifier is connected to the junction point of the third and fourth resistors. The collectrode electrode of the transistorized output amplifier is connected to the negative terminal of a d.c. supply voltage via a load resistor and also is coupled to the junction point of the series connected diode and capacitor. The collector electrode of the transistorized output amplifier is connected to the series connected diode and resistor which establishes a charging path for the charging capacitor and is also connected to an output terminal via a fifth resistor. The voltage controlled oscillator circuit includes hysteresis for providing a dead band zone until the input voltage on the noninverting input of the operational amplifier reaches a predetermined value for toggling the operational amplifier and for producing output signal pulses. The output signal pulses which are amplified by the transistor output amplifier have a frequency or repetitious rate proportional to the amplitude of the input signals applied to the input terminal.

BRIEF DESCRIPTION OF THE DRAWING

The aforementioned objects and other attendant features and advantages of the subject invention will be more readily appreciated and understood by referring to the following detailed description when considered in conjunction with the accompanying drawing wherein:

The single FIGURE illustrates a schematic circuit diagram of a preferred embodiment of a novel electronic voltage controlled oscillating circuit arrangement of the present invention.

DESCRIPTION OF THE INVENTION

Referring now to the single FIGURE of the drawing, there is shown a preferred embodiment of the unique electronic voltage controlled oscillator circuit in accordance with the teachings of the present invention. Basically, the voltage controlling oscillating circuit has a dead band and a voltage to frequency response characteristic and basically consists of an integrated circuit operational amplifier IC and a transistorized output amplifier stage OA.

As shown, the operational amplifier (op-amp) IC includes a pair of input terminals I and NI and a single output terminal 6. It will be appreciated that the operational amplifier IC is preferably of the differential input signal type of integrated circuit that is operable by the difference between the signals applied to the two input terminals NI and I. The integrated circuit op-amp IC may be of the type designated 776 which is manufactured and vended by the Fairchild Semiconductor Corporation of Mountainview, California. The input I is termed the inverting or negative input terminal and is connected to a reference voltage level, such as, ground potential via resistor R2 and lead L1. The input terminal NI is termed the noninverting or positive input terminal and is connected to an input terminal T1 of variable source of negative input voltage Vin via a current limiting resistor R1. A charging capacitor C1 is connected between input terminal NI and one end of the resistive element R1. As shown, a biasing resistor R3 connects terminal point 8 with terminal point 4 of the integrated circuit op-amp. The terminal point 4 of the operational amplifier IC is also connected to the negative supply voltage terminal B- of a suitable d.c. potential source (not shown) while the terminal point 7 of the operational amplifier IC is connected to the positive supply voltage B+ of the d.c. potential source. A feedback resistor R4 is coupled from the output terminal 6 to input terminal NI of the integrated circuit operational amplifier IC. It will be observed that the output terminal 6 of the integrated circuit IC is connected to the input of the single stage transistorized amplifier OA.

As shown, the amplifier OA includes a PNP semiconductive device or transistor Q having an emitter electrode e, a collector electrode c and a base electrode b. The output electrode 6 is resistively connected to the base electrode b of transistor Q via a resistor R5. The emitter electrode e of transistor Q is connected to the junction point J2 of a voltage divider network formed by series connected resistors R6 and R7. As shown, the upper end of resistor R6 is connected to the positive voltage supply terminal B+ while the lower end of resistor R7 is connected to the reference or ground potential. The collector electrode c of transistor Q is connected to the negative operating potential B- via a load resistor R8. The collector electrode is also connected to the junction point J1 of a series connected capacitor C2 and diode D1 via resistor R9. The one terminal or plate of capacitor C2 is connected to the other end of resistor R2 while the other terminal or plate of capacitor C2 is connected to the anode electrode of diode D1. The cathode electrode of diode D1 is directly connected to ground. The collector electrode c of transistor Q is also connected to the noninverting input terminal NI of the operational amplifier IC via a serially connected diode D2 and resistor R10. The voltage output signals Vout are derived from output terminal T2 which is connected to the collector electrode c via resistor R11. The output terminal T2 may be connected to an appropriate digital counter and associated logic circuits of the vehicular speed control system.

In describing the operation of the present voltage controlled oscillator, it will be assumed that the circuit components or elements are intact and operating properly and that the operating potentials are connected to the appropriate points as shown in the drawing. In this situation, the oscillator is in a quiescent condition until an appropriate input voltage is applied to the input terminal Vin. In actual practice, the input signal appearing on terminal T1 is a variable analog voltage Vin having an amplitude which is a function of velocity or speed of a moving vehicle in a railroad or mass and/or rapid transit system. In the operation of an existing speed control system, the variable input voltage Vin is a negative potential having a magnitude dependent upon the difference between the actual speed and the desired speed of the mass transit vehicle or train. Initially, let us assume that there is no negative input voltage appearing on terminal T1 so that the operational condition of the circuit may be analyzed. Under this condition, the inverting input I is tied to ground potential by the resistor R2 and lead L1 while the noninverting input NI is at approximately a positive 1 volt potential level. The output terminal 6 is at approximately a 12 volt potential level which is applied to the base electrode b via resistor R5 thereby rendering the transistor Q nonconductive. Thus, with transistor Q turned off the collector electrode c is at its low level so that no signal pulse is developed at the output terminal T2.

Now when a low negative input voltage Vin is developed on input terminal T1, the operational amplifier IC will not immediately switch or toggle due to the dead band response characteristic. Thus, the inherent hysteresis results in a dead band zone to initially occur up to a value of approximately minus 1 volt. That is, when a negative input voltage is applied to terminal T1 the noninverting input NI is at approximately a positive 1 volt so that it is above the ground level of inverting input I so that when the voltage on terminal T1 reaches approximately a minus 1 volt, the noninverting input NI reaches ground level. In the present case, the resistance of resistor R4 is chosen to be 12 times the resistance of resistor R1 to accomplish toggling at 1 volt. This causes the operational amplifier to toggle and to produce a negative output voltage on terminal 6. The negative voltage forwardly biases the base electrode *b* via resistor R5 so that the transistor Q is rendered conductive. The conduction of transistor Q causes a positive voltage to be developed on the output terminal T2. The conduction of amplifying transistor Q also forwardly biases the diode D2 so that a charging path is established for capacitor C1 through resistor R10. In addition, the conduction of transistor Q causes the voltage on the inverting input terminal I to substantially assume a positive value. It will be noted that as the noninverting input terminal begins to rise in a positive direction at a rate determined by the time constant R10C1, the inverting input terminal NI begins to decay at a rate determined by the time constant R2C2. When the voltage levels on the two inputs become equal to each other, the operational amplifier IC will revert to its original operating condition. That is, when the inverting input I coincides with the non-inverting input WI, the operational amplifier IC will switch or toggle, and the output terminal 6 will again assume an approximately positive 12 volt value. Thus, the positive voltage reverse biases the base electrode *b* so that the output amplifying transistor Q is rendered nonconductive. The non-conduction of amplifying transistor Q causes the output voltage on terminal T2 to return to its low level condition so that a positive pulse is developed on the terminal T2. The turning off of transistor Q also results in the back biasing of diodes D1 and D2 so that the inverting input terminal I again assumes ground potential through resistor R2. Now when the voltage at noninverting input NI reaches the ground potential level due to the presence of the negative input voltage on terminal T1, the operational amplifier IC again toggles to produce a negative voltage at the output terminal O which forwardly biases the base electrode *b* to turn on the transistor Q. The conduction of amplifying transistor Q again produces a positive voltage on output terminal T2. The sequence of operation will again be repeated as described above so that the operational amplifier IC will reset itself and another output signal pulse will be developed on the output terminal T2. The operation will repeat and pulses will continue to be produced on terminal T2 so long as sufficient negative input voltage appears on the input terminal T1. It will be appreciated that the repetitious rate or frequency of the output signal pulses is a function of negative voltage level that is applied to the input terminal T1. That is, the higher the amplitude of the negative input signal on terminal T1 the greater the frequency of the amplified output signal pulses on terminal T2. Thus, the frequency or repetitious rate of the signal pulses increases and decreases in accordance with the level of the analog input voltage Vin.

It will be appreciated that while the present invention finds particular utility in speed control systems for railway and mass and/or rapid transit operations, it is understood that the invention may be employed in other equipment and apparatus which have need of its unique operation.

In addition it will be readily evident that this invention may be utilized in other systems and installations, such as, security, signaling communication, telemetry, etc., which require the dead band and/or voltage to frequency response characteristics.

Additionally, it will be understood that various changes, modifications and alterations may be made to the circuit without departing from the spirit and scope of the invention. For example, the PNP transistor of the output amplifier OA may be replaced by an NPN transistor simply by reversing the biasing and supply potentials and the polarity of the diodes D1 and D2. In addition, it will be appreciated that other types of integrated circuit operational amplifiers may be used in practicing the present invention. Further, the dead band zone may be varied by changing the hysteresis of the circuit. Accordingly, it will be appreciated that although the subject invention has been described and illustrated in detail it is understood that other modifications will occur to persons skilled in the art and all are considered to be within the spirit and scope of the invention.

Having now described the invention what I claim is:

1. A voltage controlled oscillator circuit comprising, an operational amplifier having a first and a second input terminal and an output terminal, a first resistor connected between said first input terminal and a reference potential, a current limiting resistor connected between said second input terminal and an input signal voltage, a charging capacitor connected between one end of said first resistor and said second input terminal, a series connected diode and capacitor connected between the other end of said first resistor and the reference potential, a feedback resistor connected between said output terminal and said second input terminal, a solid state output amplifier having an input and an output circuit, said output terminal coupled to said input circuit of said solid state output amplifier, said output circuit resistively coupled to the junction of said series connected diode and capacitor, and a series connected diode and resistor connected between said output circuit of said solid state output amplifier and said charging capacitor, whereby a dead band zone occurs until the input signal voltage on said second input terminal reaches a predetermined value for toggling said operational amplifier and for producing output signals having a frequency proportional to the amplitude of the input signal voltage.

2. The voltage controlled oscillator circuit as defined in claim 1, wherein said current limiting resistor couples the input signal voltage to a noninverting input of said operational amplifier.

3. The voltage controlled oscillator circuit as defined in claim 1, wherein said first resistor is coupled to an inverting input of said operational amplifier to the reference voltage.

4. The voltage controlled oscillator circuit as defined in claim 1, said operational amplifier is a differential type of integrated circuit amplifying device.

5. The voltage controlled oscillator circuit as defined in claim 1, wherein a feedback path including said feedback resistor is coupled between said output to a noninverting input of said operational amplifier.

6. The voltage controlled oscillator circuit as defined in claim 1, wherein said output amplifier includes a transistor having an emitter, a collector and a base electrode.

7. The voltage controlled oscillator circuit as defined in claim 6, wherein a charging path is established for said charging capacitor via said series connected diode and resistor when said transistor is rendered conductive.

8. The voltage controlled oscillator circuit as defined in claim 6, wherein said collector electrode is resistively connected to the junction point of a series connected diode and capacitor for rendering said diode conductive when said transistor is rendered conductive.

9. The voltage controlled oscillator circuit as defined in claim 6, wherein said base electrode is resistively coupled to said output of said operational amplifier.

10. The voltage controlled oscillator circuit as defined in claim 6, wherein said emitter electrode is connected to the junction joint of a pair of series connected resistors, said amplified signal pulses are derived from said collector electrode.

* * * * *